United States Patent [19]

Akama et al.

[11] Patent Number: 4,761,044
[45] Date of Patent: Aug. 2, 1988

[54] FRAME STRUCTURE FOR HOUSING PANEL PLATES

[75] Inventors: Toyohiko Akama; Masashi Iino, both of Tokyo; Osamu Igarashi, Yokohama, all of Japan

[73] Assignee: Nikko Kogyo Kabushiki Kaisha, Tokyo, Japan

[21] Appl. No.: 93,626

[22] Filed: Sep. 8, 1987

[30] Foreign Application Priority Data

Oct. 7, 1986 [JP] Japan .............................. 61-153117[U]

[51] Int. Cl.⁴ ............................................. E05D 15/58
[52] U.S. Cl. .................................... 312/110; 312/250; 312/331
[58] Field of Search ................. 312/110, 331, 323, 91, 312/97, 250

[56] References Cited

U.S. PATENT DOCUMENTS

| | | | |
|---|---|---|---|
| 363,647 | 5/1887 | Knaus | 312/331 |
| 591,134 | 10/1897 | Howard | 312/331 |
| 2,214,291 | 9/1940 | Wyckoff | 312/331 |
| 2,841,410 | 7/1958 | Kessler, Jr. et al. | 312/250 |
| 3,093,429 | 6/1963 | Christen et al. | 312/331 |
| 3,323,853 | 6/1967 | Stark | 312/110 |
| 3,794,401 | 2/1974 | Dean et al. | 312/110 |
| 4,375,907 | 3/1983 | Van der Kooi et al. | 312/110 |
| 4,428,304 | 1/1984 | Moser | 312/331 |
| 4,600,254 | 7/1986 | Whalen | 312/110 |

Primary Examiner—Victor N. Sakran
Attorney, Agent, or Firm—Martin Smolowitz

[57] ABSTRACT

Frame structure for housing panel plates such as printed circuit boards. This structure is capable of housing panel plates having varying width, and consists of a top plate that is spaced from a bottom plate fixed thereto by means of support columns. The structure also has an immovable side board and a movable side board between the top and bottom plates. Each of the opposing side boards has a plurality of lateral grooves for housing the plates. The movable side board is easily movable while it is kept parallel to the immovable side board.

4 Claims, 3 Drawing Sheets

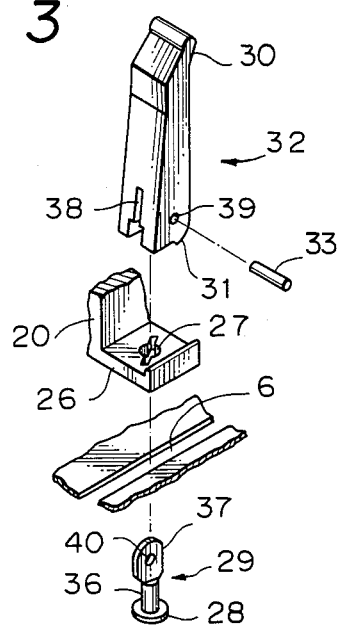
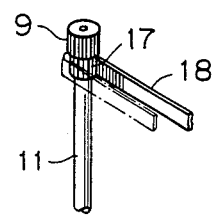
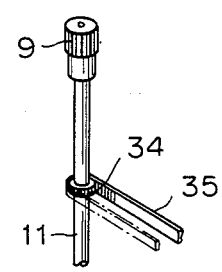
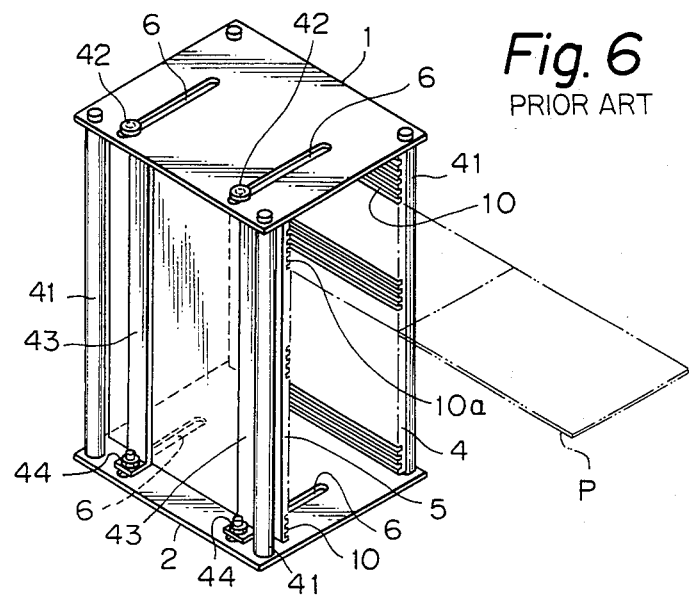
Fig. 6 PRIOR ART

FRAME STRUCTURE FOR HOUSING PANEL PLATES

BACKGROUND OF THE INVENTION

1. Field of the Invention

The present invention relates to a frame structure for housing printed-circuit boards to be assembled in electric and electronic devices, as well as panel plates for use in other industrial fields (e.g. panels used as construction materials). More particularly, the present invention relates to a frame structure that is capable of accommodating variations in the width dimensions of the panel plates to be housed.

2. Description of the Prior Art

A prior art frame structure that is capable of housing panel plates having varying widths is shown in FIG. 6. The frame structure consists of a top plate 1 that is spaced from a bottom plate 2 and fixed thereto by means of four support columns 41. The frame structure also has an immovable side frame board 4 that is erected on either the left or right side, and a movable side frame board 5 that is erected on the other side and which is movable in the horizontal direction.

The opposing inner faces of the two side frame boards 4 and 5 are provided with a plurality of horizontally extending lateral grooves and a panel plate P is supported by one lateral groove on the frame board 4 and a corresponding groove on the other frame board 5. In order to secure the movable side frame board 5 at a desired position, a pair of sliding frames 43 are arranged between the top plate 1 and the bottom plate 2. Each of the plates is provided with a pair of parallel slots 6 through which are respectively inserted the threaded portions of fastening members 42 such as hexagon headed bolt or thumbscrew, protruded upwardly and downwardly from the sliding frames, that can fasten said frames 43 by mating members 44 such as nut at the outside of the movable frame board 5. Sliding frames 43 are disposed outside the movable side frame board 5 at a position corresponding to the slot 6 in such a manner that each of the frames 43 is secured at its top and bottom by means of a combination of the fastening member 42 and a mating member 44 such as a nut.

By proper adjustment of the sliding frames 43, the side frame board 5 can be fixed at such a position that the distance between the two side frame boards becomes equal to the width of each of the panel plates P to be housed. It then becomes possible to slide the panel plates along opposing lateral grooves 10 and 10a on the two side frame boards and support them in position.

A problem with the prior art frame structure shown in FIG. 6 is that since the tendency of the movable side frame board 5 to deflect increases as the size of the frame structure increases, pushing or pulling a certain portion of the frame board 5 by hand is not sufficient to allow equal forces to act on the threaded portions of all the fastening members 42 in the slots 6. The four fastening members 42, two of them being on the top plate 1 and the other two on the bottom plate 2, will not move over equal distances and instead, a great resistance will work solely on the threaded portion of the fastening member 42 in a certain slot 6, thereby making it difficult for the side frame board 5 to move smoothly. Even if one can manage to move the frame board 5, the distance between two side frame boards 4 and 5 will sometimes vary at the top and bottom portions or at the front and rear portions. Such variations in the distance between the two side frame boards will cause problems in subsequent housing of panel plates and must be eliminated by a certain readjustment operation.

SUMMARY OF THE INVENTION

An object, therefore, of the present invention is to provide a frame structure that is free from the aforementioned defects of the prior art structure and the width of which can be readily adjusted for accommodating panel plates of varying width.

The frame structure of the present invention which is capable of attaining this object comprises:
- a top plate that is parallel to and spaced from a bottom plate;
- a pair of side frame boards vertically disposed between said top and bottom plates, the inner surfaces of said side frame boards that face each other being provided with a plurality of lateral grooves for receiving panel plates, one of said frame boards being immovable and fixed to the top and bottom plates, and the other side frame board being movable toward or away from the immovable frame board until it stops at a predetermined position; and
- a pair of juxtaposed guide rails on the inner surface of each of the top and bottom plates, the movable side frame board being capable of moving along said guide rails by engagement in a rack and pinion relationship, the pinions being rotatably mounted at the four corners of the movable side frame board and being operatively associated with one another in such a manner that the driving of one pinion causes the others to be driven simultaneously.

Because of the rack and pinion relationship provided in the frame structure of the present invention, the force applied to a certain portion of the movable side frame board creates a force that causes all of the four pinions to rotate by equal amounts.

In the frame structure of the present invention, the pinions rotatably mounted near the four corners of the movable side frame board are interlocked in such a way that when one pinion is rotated, the other pinions are rotated in unison by exactly the same amount. Since a rack provided in a direction perpendicular to the immovable side frame board meshes with each of the pinions, the four pinions, when rotated by equal amounts, will move on their associated racks by equal distances, allowing the four corners of the movable side frame board to simultaneously move equal distances. As a result, moving one pinion causes the movable side frame board to be moved toward or away from the immovable side frame board, with the two side frame boards being kept parallel to each other, thereby allowing for easy adjustment of the distance between the two side frame boards.

BRIEF DESCRIPTION OF THE DRAWINGS

FIG. 3 is an exploded perspective view of the clip-type fastening device used in the frame structure of the present invention;

FIGS. 4 and 5 are perspective views showing two embodiments of the transmission device used in the frame structure of the present invention; and FIG. 6 is a perspective view showing a frame structure of the prior art.

DESCRIPTION OF THE PREFERRED EMBODIMENT

Figure 1:
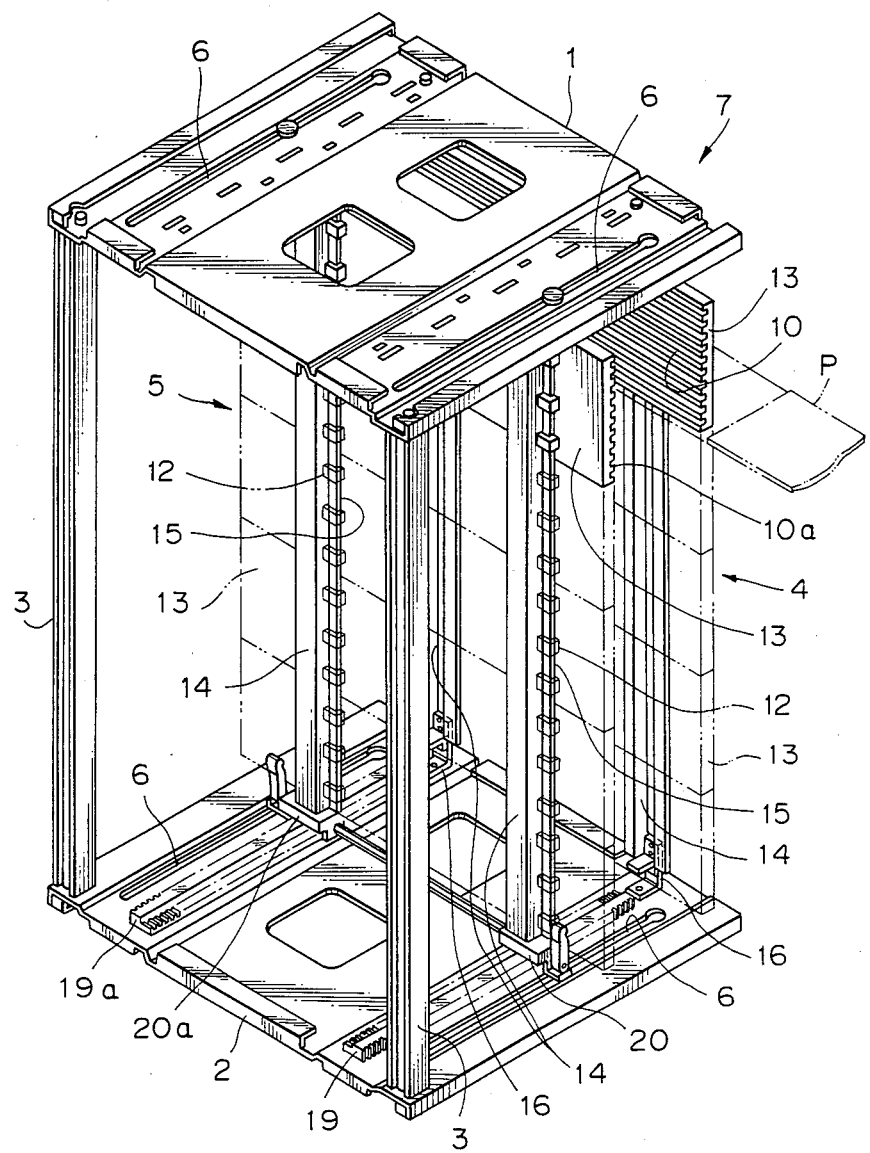
FIG. 1 is a perspective view showing a frame structure according to one embodiment of the present invention.

A preferred embodiment of the frame structure of the present invention is hereunder described with reference to the accompanying drawings. FIG. 1 is a perspective view showing the frame structure according to the preferred embodiment of the present invention. This frame structure has a top plate 1 and a bottom plate 2 each of which is made of a galvanized sheet steel or the like that is bent in a certain configuration with a press to provide appropriate rigidity. The frame structure also has an immobilized side frame board 4 and a movable side frame board 5 which have a plurality of parallel support grooves 10 and 10a, respectively, formed on their inner surfaces. Usually, each of the side frame boards is formed of a single plate, but a large side frame board may be composed of a plurality of small unit boards each of which has parallel lateral grooves 10 on its inner surface and which are combined in such a way that the lateral grooves in one unit board lie above those in an underlying unit. Each of the unit plates 13 is provided with a pair of hooks 12 on its outer surface that are positioned such as to face each other. A plurality of such unit plates 13 are stacked one on top of another within the same plane and the web 15 of a channel member in hat form 14 (this channel member is hereinafter referred to as a hat steel) is inserted into the space defined by a row of hooks 12 in alignment. In other words, the plurality of unit plates 13 are interconnected by hat steels to form a unitary side frame board.

The immovable side frame board 4 is secured to both the top plate 1 and the bottom plate 2 at either the right or left side of the housing frame 7 by means of angle members 16 attached to both the upper and lower ends of the hat steel 14. Support columns 3 are erected at the two corners of the other side of the frame structure 7 so as to support and fix the top plate 1 and the bottom plate 2 at a specified distance. In other words, the top plate 1, bottom plate 2, the hat steels 14 on the immovable side frame board 4, angle members 16 and support columns 3 combine to form a box-shaped structure that has sufficient rigidity to be usable as a frame structure.

Guide rails 19, 19a are provided on the inner surfaces of top plate 1 and bottom plate 2 at right angles with respect to the immovable side frame board 4 such that the movable side frame board 5 can be moved toward or away from the immovable side frame board 4, with the two side frame boards remaining parallel to each other. A slider 20 riding over each guide rail 19 is provided under the movable side frame board 5. The guide rails 19, 19a are provided at positions corresponding to the pinions near the four corners of the movable side frame board 5; in other words, two guide rails 19 and 19a are mounted on each of the top plate 1 and the bottom plate 2, totalling four in number.

Figure 2:
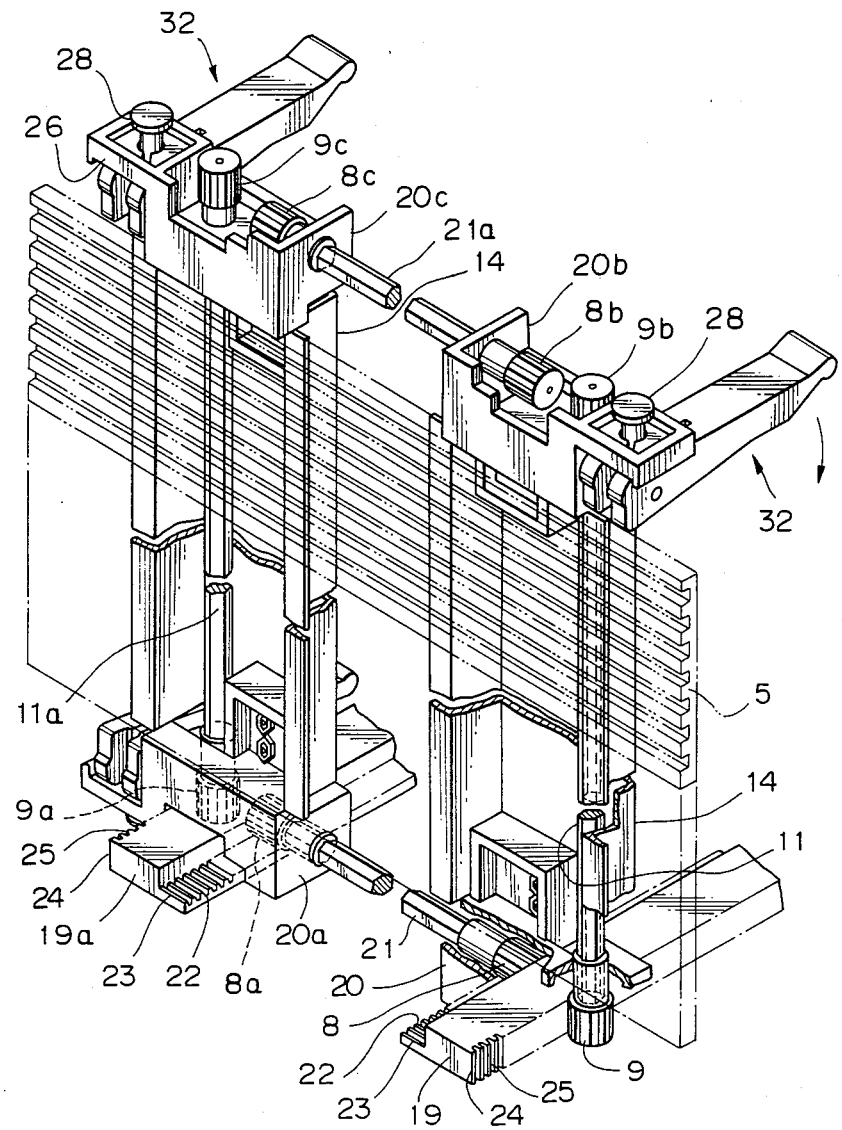
FIG. 2 is a partial cutaway view of FIG. 1.

FIG. 2 is a partial cutaway view of the essential part of the embodiment shown in FIG. 1. Sliders 20 and 20a are secured to the bottom of hat steels 14, and sliders 20b and 20c are secured to the top of the same hat steels. Two pinions 8 and 9 that are arranged in such a manner that their axes cross each other at right angles are rotatably mounted in the interior of the slider 20. Three other groups of pinions 8a–9a, 8b–9b, and 8c–9c are also similarly arranged in the interior of the sliders 20a, 20b and 20c, respectively. Since each of the sliders has substantially the same construction, the following explanation is directed solely to the sliders shown in the lower part of FIG. 2. Pinions 8 and 8a on guide rails 19 and 19a that rotate about their horizontal axis are interconnected by a single rotational axis 21. Pinion 9 that is associated with the guide rail 19 and which rotates about the vertical axis is connected by a single vertical rotational axis 11 to pinion 9b that is shown in the upper part of FIG. 2. Pinion 9a that is associated with the guide rail 19a and which rotates about the vertical axis is connected by a single vertical rotational axis 11a to pinion 9c that is also shown in the upper part of FIG. 2. Pinions 8b and 8c that are shown in the upper part of FIG. 2 have horizontal axes of rotation and are similarly connected by a single horizontal axis of rotation 21a. Thus, it will be seen from the above that pinions 8 and 9 combine with slider 20 and the four units of such combination are provided at the four corners of the movable side frame board 5, two of them on top and the other two on bottom.

Each of the guide rails 19, 19a has a step formed in its inward portion, with a rack 22 being formed along the entire length of the horizontal surface 23 of the step and a rack 25 formed along the entire length of the outward lateral surface 24 of the rail. The rack 22 meshes with pinion 8 and the other rack 25 meshes with pinion 9.

In the arrangement described above, pinion 9 is linked to pinion 9b by shaft 11, pinion 9b is interlocked with pinion 8b by guide rail 19b (not shown), pinion 8b is linked to pinion 8c by shaft 21a, pinion 8c is interlocked with pinion 9c by a guide rail 19c (not shown), pinion 9c is linked to pinion 9a by shaft 11a, pinion 9a is interlocked with pinion 8a by guide rail 19a, pinion 8a is linked to pinion 8 by shaft 21, and pinion 8 is interlocked with pinion 9 by guide rail 19. If any one of these pinions is caused to rotate, all other pinions are caused to rotate in a specified direction by the interlocking mechanism described above, thereby permitting the movable side frame board 5 to move smoothly along the guide rails while it remains parallel to the immovable side frame board 4.

In the embodiment shown in FIGS. 1 and 2, two pinions which are arranged in such a way that their axes cross each other at right angles are provided for all of the four sliders 20, 20a, 20b and 20c disposed near the four corners of the movable side frame board 5 and hence, the number of pinions used totals eight. However, the frame structure of the present invention is not limited to this specific embodiment only, and all that is required for the invention is that it has a mechanism for allowing the four corners of the movable side frame board 5 to move equal distances. This requirement can be met satisfactorily by providing at least one pinion for each slider and combining it with a rack that is disposed at four positions of the frame structure.

FIG. 4 shows an example of the means for interlocking the combination of pinions 9 and 9b and shaft 11 with the combination of pinions 9c and 9a and shaft 11a. As shown, a belt pulley 17 is provided at the portion of shaft 11 that is near to pinion 9 at an end thereof and this pulley is interlocked by a belt 18 with another belt pulley (not shown) disposed near pinion 9a on the other shaft 11a. In a similar manner, a belt pulley is provided at the portion of shaft 11 that is near pinion 9b at the other end thereof and this pulley is interlocked by a belt (not shown) with another belt pulley (also not shown) disposed near pinion 9c on the other shaft 11a. This interlocking mechanism will attain the same effect as achieved by the embodiment shown in FIGS. 1 and 2.

In FIG. 5, a belt pulley 34 is provided in the middle of the shaft 11 and interlocked by another belt pulley (not shown) that is also provided in the middle of the shaft 11a. This interlocking mechanism also attains the same effect as that achieved by the embodiment shown in FIGS. 1 and 2.

FIG. 3 is an exploded perspective view of the clip-type fastening device used in the embodiment shown in FIG. 1. Each of the sliders 20 has as an integral part thereof a fastening lug 26 that projects outwardly to come in contact with the inner surface of each of the top plate 1 and the bottom plate 2 (see FIG. 1). This lug 26 has a mounting hole 27 that is made at a position corresponding to the slot 6 formed in the top and bottom plates 1 and 2 parallel to the guide rails 19, 19a . . . The shape of the mounting hole 27 is a combination of a circle and a rectangle. The circular portion of the hole 27 is large enough to receive the cylindrical portion 36 of a tension rod 29, and the rectangular portion of the hole 27 has a shape that is adapted to permit insertion of the flat portion 37 of one end of the tension rod 29. The other end of the cylindrical portion 36 is provided with a flange 28. A lock lever 32 is mounted on top of the fastening lug 26. The upper part of the lock lever serves as a lever action arm 30 and the lower part is provided with a slot 38 for receiving the flat protin 37 of the tension rod 29. A cam surface 31 is formed on one side of the lower part of the lock lever.

The fastening device is constructed by the following procedure. First, the lug 26 is placed on top of the slot 6 in such a manner that the slot 6 comes into registry with the hole 27 in the lug. Then, the tension rod 29 is inserted into the hole 27 through slot 6 from below. The flat portion 37 of the tension rod 29 that projects upward of the lug 26 is fitted into the slot 38 in the lever 32, and a pin 33 is inserted into a hole 39 in the lever 32 and a hole 40 in the tension rod 29 that is in alignment with hole 39. In the fastening device constructed in this way, the action arm 30 is capable of pivoting about the pin 33.

In the embodiment shown in FIG. 3, the cam surface 31 is designed to have such a geometrical profile that when the arm 30 is brought into a resting position (horizontal in FIG. 2), the tension rod 29 will depart from the fastening lug 26 causing the flange 28 to move away from the underside of the plate in which the slot 6 is formed so as to create an unlocked state, and that when the arm 30 is pushed downward in the direction indicated by the arrow in FIG. 2, the tension rod 29 will move closer to the fastening lug 26, causing the flange 28 to be urged against the underside of the slotted plate so as to create a locked state.

The clip-type fastening device that can be used in the present invention is by no means limited to the lock lever 32 that is shown in FIG. 3 and which has a cam surface 31 formed on its outer periphery. According to an alternative method, the tension rod 29 is secured against rotation by two parallel surfaces that are formed on the outer periphery of the rod and which are equal in width to the slot 6. In addition, the tension rod 29 is provided with a threaded portion that is capable of engaging a bolt which is threaded into that portion from above the fastening lug 26. In this alternative method, the tension rod 29 can be brought close to or away from the fastening lug 26 by tightening or loosening the bolt.

The method of using the frame structure of the present invention is hereunder described with reference to the embodiment shown in FIG. 1 and assuming the case where the distance between support grooves 10 and 10a formed on the inner surfaces of the immovable side frame board 4 and the movable side frame board 5 in such a manner that every two opposing grooves lie in the same horizontal plane is to be adjusted to be slightly greater than the width of each of the panel plates P to be housed. First, the arm 30 of the lock lever 32 is brought to a resting position so that it is unlocked. In the next place, either a pushing or pulling force is applied to a certain part of the movable side frame board 5, whereupon the side frame board 5 is moved and one of the pinions 8 . . . and 9 . . . in the sliders 20 disposed near the four corners of the board 5 that receives the greatest force will start to rotate. Since any two adjacent pinions are interlocked with each other, all of the pinions within the sliders 20 at the four positions will simultaneously rotate by the same amount. As a result, all of the pinions which are interlocked with one another will roll over the associated racks to allow the four corners of the movable side frame board 5 to move equal distances. This means that in the absence of any other force the movable side frame board 5 can be moved smoothly as it remains parallel to the immovable side frame board 4. Then, one of the panel plates P to be housed is inserted temporarily into either one of pair-making support grooves 10 and 10a that lie in the same horizontal plane, with the plate P being used as a positioning jig, and the arm 30 of the lock lever 32 is actuated to a locking position, with any force that will displace the movable side frame board 5 from the position at which the plate P is supported by the grooves 10 and 10a being eliminated. The above procedures will complete the positioning of the movable side frame board 5 and, as in the case of prior art frame structures, the other panel plates P are subsequently housed in the frame structure of the present invention and transported to an assembly shop.

What is claimed is:

1. A frame structure for housing panel plates, comprising:

a top plate that is parallel to and spaced from a bottom plate;

a pair of side frame boards vertically disposed between said top and bottom plates, the inner surfaces of said side frame boards that face each other being provided with a plurality of lateral grooves adapted for receiving panel plates, one of said frame boards (4) being immovable and fixed to the top and bottom plates, and the other side frame (5) being movable toward or away from the immovable frame board (4) until it stops at a predetermined position;

a pair of juxtaposed guide rails (19, 19a) provided on the inner surface of each of said top and bottom plates, the movable side frame board (5) being provided with a pair of sliders (20) which each rides over one of the guide rails so that the movable side frame board is movable along said guide rails by engagement in a rack and pinion relationship, the pinions being rotatably mounted at the four corners of the movable side frame board and being operatively associated with one another in such a manner that the driving of one pinion causes the others to be driven simultaneously, wherein each of said top and bottom plates is provided with a slot that extends along each guide rail, each of said sliders being provided with an outwardly extended fastening lug through which a tension rod having a flange is received by each respective slot for locking and unlocking the movable side frame board by urging the flange against the slotted plate by operation of a lock lever pivotally mounted to the tension rod.

2. A frame structure according to claim 1, wherein said lock lever is provided with a cam surface formed on one side of the lower part thereof.

3. A frame structure according to claim 1 wherein the top and bottom pinions provided on each side of said side frame board are interconnected by a longitudinal rod, and the two top pinions and the two bottom pinions are respectively interlocked by associated lateral rods through a gearing engagement with guide rails associated with the respective pinions.

4. A frame structure according to claim 3 wherein the two pinions on the top side of the movable side frame board are interconnected by means of a belt driving device, and the two pinions on the bottom side of said side frame board are also interconnected by means of a similar belt driving device.

* * * * *